(12) United States Patent
Takahashi et al.

(10) Patent No.: US 6,241,162 B1
(45) Date of Patent: Jun. 5, 2001

(54) ULTRASONIC SHOWER CLEANING APPARATUS

(75) Inventors: Seigo Takahashi; Hironobu Suzuki; Norihisa Takahashi, all of Tokyo (JP)

(73) Assignee: Kaijo Corporation (JP)

( * ) Notice: Subject to any disclaimer, the term of this patent is extended or adjusted under 35 U.S.C. 154(b) by 0 days.

(21) Appl. No.: 09/404,621

(22) Filed: Sep. 23, 1999

(30) Foreign Application Priority Data

Jun. 23, 1999 (JP) .................................................. 11-176723

(51) Int. Cl.[7] .......................................................... B05B 1/08
(52) U.S. Cl. .......................................................... 239/102.2
(58) Field of Search ............................. 239/102.2, 102.1; 134/198

(56) References Cited

U.S. PATENT DOCUMENTS

| | | | |
|---|---|---|---|
| 4,004,736 | * 1/1977 | George | 239/102.2 |
| 4,326,553 | 4/1982 | Hall | 134/153 |
| 4,834,124 | 5/1989 | Honda | 134/184 |
| 4,844,343 | * 7/1989 | Kurokawa et al. | 239/102.2 |
| 4,930,701 | * 6/1990 | Porter et al. | 239/102.2 |
| 5,154,347 | * 10/1992 | Vijay | 239/102.2 X |
| 5,368,054 | * 11/1994 | Koretsky et al. | 239/102.2 X |
| 5,449,502 | * 9/1995 | Igusa et al. | 239/102.2 X |
| 5,927,306 | 7/1999 | Izumi et al. | 134/155 |

FOREIGN PATENT DOCUMENTS

| | | |
|---|---|---|
| 62-159800 | 7/1987 | (JP) . |
| 63-305517 | 12/1988 | (JP) . |
| 5-200370 | 8/1993 | (JP) . |
| 2521730 | 8/1996 | (JP) . |

* cited by examiner

*Primary Examiner*—Lesley D. Morris
(74) *Attorney, Agent, or Firm*—Lerner, David, Littenberg, Krumholz & Mentlik, LLP

(57) ABSTRACT

An ultrasonic shower cleaning apparatus includes a casing, a nozzle mounted to the downstream end of the casing, a substantially circular ultrasonic transducer operable to emit ultrasonic waves and oriented to face the upstream end of the nozzle, and an inlet port formed in the periphery of the casing to receive a cleaning liquid. The nozzle includes a right circular cylindrical outlet port through which the cleaning liquid along with the ultrasonic waves are released so as to ultrasonically clean an article. The outlet port extends axially through the nozzle and has a fixed diameter. The upstream end face of the nozzle is cone-shaped so as to be tapered in a direction toward the downstream end of the nozzle from its outer edge to the outlet port at a predetermined angle of inclination.

25 Claims, 8 Drawing Sheets

ULTRASONIC SHOWER CLEANING APPARATUS

BACKGROUND OF THE INVENTION

The present invention relates to an ultrasonic shower cleaning apparatus for ultrasonically cleaning articles with a shower of cleaning liquid and associated ultrasonic waves.

It is well known that an ultrasonic shower cleaning apparatus uses a shower of cleaning liquid to ultrasonically clean a liquid crystal display, a semiconductor wafer or other articles. One such apparatus is shown in FIGS. 7 and 8. As shown, a conventional ultrasonic shower cleaning apparatus 20 includes a cylindrical casing 21, and a nozzle 22 mounted to the downstream end of the casing 21. An ultrasonic vibratory element or ultrasonic transducer 23 of a circular disk is oriented to face the upstream end of the nozzle 22. An inlet port 24 is formed in the lateral periphery of the casing 21 to receive a cleaning liquid. The cleaning liquid fed through the inlet port 24 is discharged or spouted from the downstream end of the nozzle 22.

The nozzle 22 has an outlet port 22a. The outlet port 22a has a hollow circular upper section 22a$_1$, of a fixed diameter, and a conical lower section 22a$_2$ tapered from the upper section 22a$_1$ toward its downstream end. One objective of this design is to provide a strong stream of the cleaning liquid as spouted through the downstream end of the nozzle 22. Another objective is to focus ultrasonic waves to a given focal point by allowing some of the ultrasonic waves emitted by the ultrasonic transducer 23 to pass straight through or along the axis of the outlet port 22a and causing the other ultrasonic waves to be reflected within the lower section 22a$_2$ before they exit from the downstream end of the nozzle 22. This increases the intensity of ultrasonic energy and enables more effective cleaning of articles placed on such a focal point.

Reference numeral 25 denotes three bolt holes (two of them are shown in FIG. 7) formed in the lateral periphery of the casing 21 to secure the ultrasonic shower cleaning apparatus 20 in place. Referring specifically to FIG. 8, the ultrasonic shower cleaning apparatus 20 is secured to a suitable support by bolts 26. A feed pipe 27 is coupled to the inlet port 24 to feed a cleaning liquid thereto. An adapter 28 is attached to the upper end of the casing 21 to feed electric power to the ultrasonic transducer 23. The adapter 28 has a cord 28a connected to an ultrasonic generator (not shown).

In the apparatus 20 of FIG. 7, ultrasonic waves are focused to a point downstream of the nozzle after they propagate from the ultrasonic transducer. This arrangement enables effective cleaning of an article when placed on that point, but requires fine adjustment of the distance between the article and the tip of the nozzle. This adjustment is cumbersome, and satisfactory cleaning can not be effected on a constant basis unless such fine adjustment is made.

Accordingly, it is an object of the present invention to provide an ultrasonic shower cleaning apparatus which eliminates the need to finely adjust the distance between a tip of a nozzle and articles to be cleaned and which facilitates positioning of articles relative to the tip of the nozzle.

SUMMARY OF THE INVENTION

To achieve the foregoing object, the present invention provides an ultrasonic shower cleaning apparatus for ultrasonically cleaning an article. The apparatus comprises a casing having an upstream end, a downstream end and a lateral periphery, the casing including an inlet port formed in the lateral periphery through which a cleaning liquid is introduced thereinto; a nozzle mounted to the downstream end of the casing and having an upstream end and a downstream end, the nozzle including an outlet port of a substantially right circular cylindrical shape which has a fixed diameter and extends axially through the nozzle, the outlet port being communicated with the inlet port; and an ultrasonic transducer of a circular disk shape mounted within the casing and oriented to face the upstream end of the nozzle, the ultrasonic transducer being operable to emit ultrasonic waves toward the upstream end of the nozzle. The nozzle has an upstream end face and an outer edge, wherein the upstream end face of the nozzle is cone-shaped so as to be tapered in a direction toward the downstream end of the nozzle from the outer edge of the nozzle to the outlet port at a predetermined angle. In the apparatus thus constructed, an article placed in front of the nozzle is cleaned with cleaning liquid and ultrasonic waves spouted from the outlet port at the downstream end of the nozzle.

With this arrangement, a cleaning liquid, after fed into the casing through the inlet port, enters the upstream end of the outlet port. The cleaning liquid is then ejected through the downstream end of the outlet port. Simultaneously, ultrasonic waves propagate from the ultrasonic transducer. Some of the ultrasonic waves are directly and axially transmitted through the outlet port without any reflection within the outlet port. As such, these ultrasonic waves will not be focused to any point. The other ultrasonic waves are repeatedly reflected between a face of the ultrasonic transducer and the cone-shaped upstream end face of the nozzle before the other ultrasonic waves enter the outlet port, and the other ultrasonic waves are then repeatedly reflected within the outlet port, thereafter the other ultrasonic waves are ejected through the downstream end of the outlet port. Many of these reflected ultrasonic waves will not be focused since the outlet port has a cylindrical shape with a fixed diameter. In other words, a column stream of cleaning liquid as formed through the outlet port can be irradiated over the entire area thereof with the ultrasonic waves. This eliminates the need for fine adjustment of the distance between the tip of the nozzle and an article to be cleaned.

In a preferred embodiment, a guide mechanism is arranged on the lateral periphery of the nozzle for directing a flow of the cleaning liquid fed through the inlet port to an entrance of the outlet port as a uniform flow. This uniform flow allows the cleaning liquid to form a column stream ejected from the downstream end of the outlet port. Advantageously, as the column stream has a substantially uniform density, the column stream is efficiently irradiated with ultrasonic waves. This improves the cleaning effect.

In one embodiment, the guide mechanism includes a plurality of axially spaced annular flanges. The annular flanges may conveniently be provided by forming annular grooves around the nozzle.

One of the annular flanges which is located closest to the ultrasonic transducer forms the upstream end face of the nozzle. When ultrasonic waves propagate from the ultrasonic transducer, some of the ultrasonic waves are reflected from the upstream end face of the nozzle. Some other ultrasonic waves are transmitted through the annular flange. The flange has a thickness so that standing waves exist within the annular flange to effectively reflect the ultrasonic waves.

Preferably, the thickness of the flange is approximately one-fourth of the wavelength of the ultrasonic waves which are transmitted through the flange. This design brings about a reduction in the thickness of the annular flanges, resulting in the size and weight of the nozzle being reduced.

DETAILED DESCRIPTION OF THE PREFERRED EMBODIMENT

The present invention will now be described by way of example with reference to the accompanying drawings.

Figure 1:
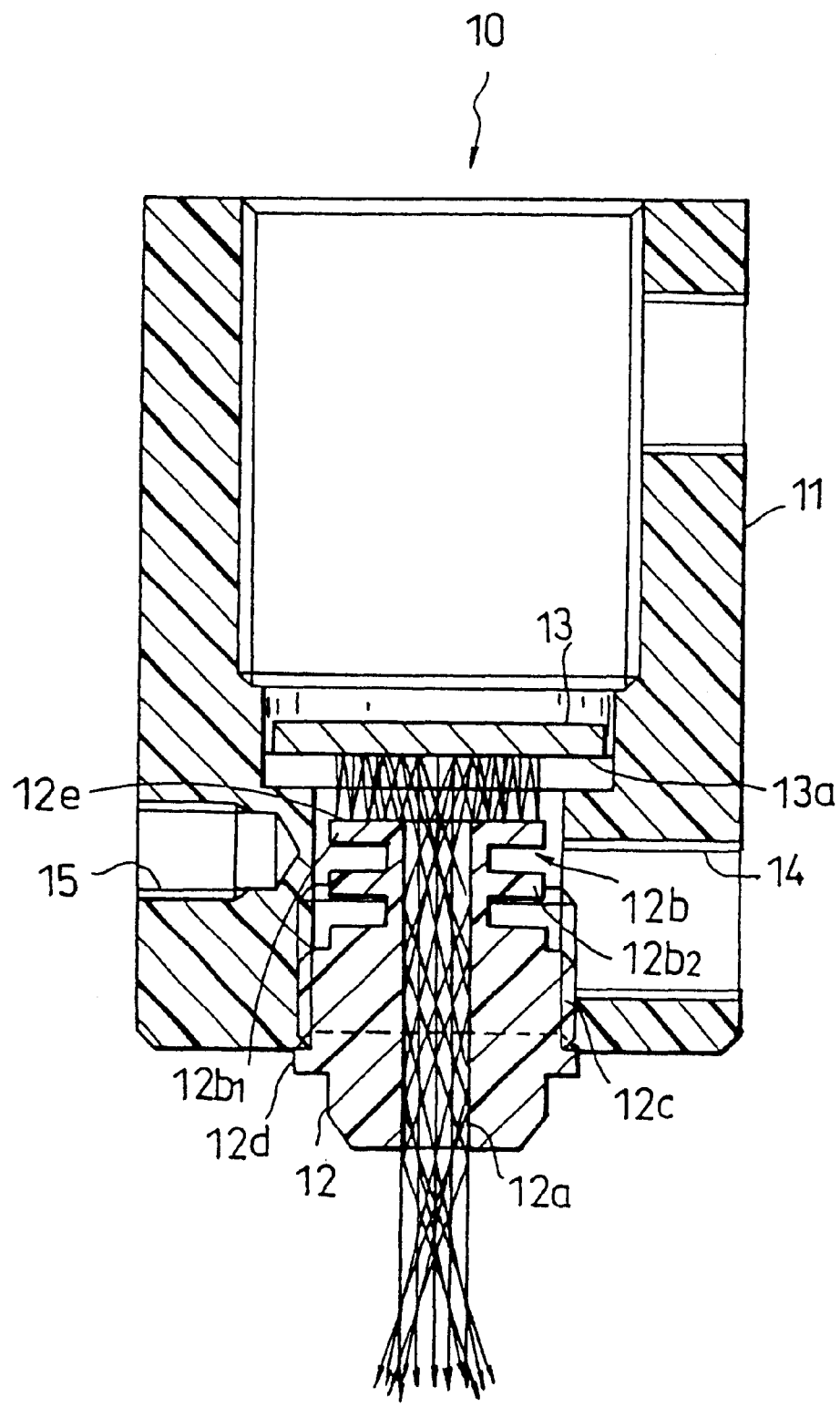
FIG. 1 is a vertical sectional view showing an ultrasonic shower cleaning apparatus according to one embodiment of the present invention.
Figure 2A:
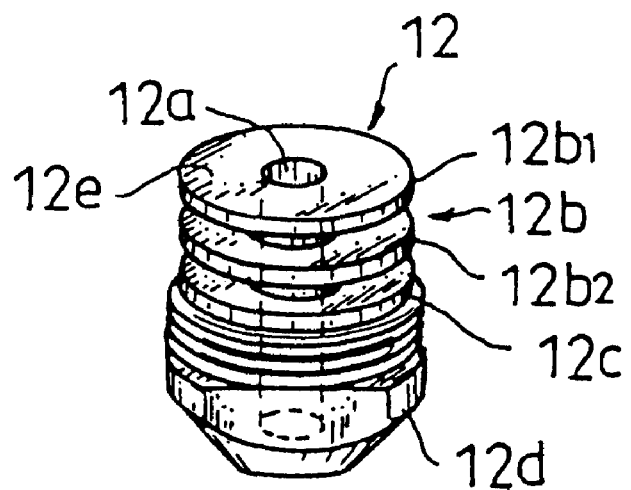
FIG. 2A is a perspective view showing a nozzle incorporated in the apparatus shown in FIG. 1.
Figure 2B:
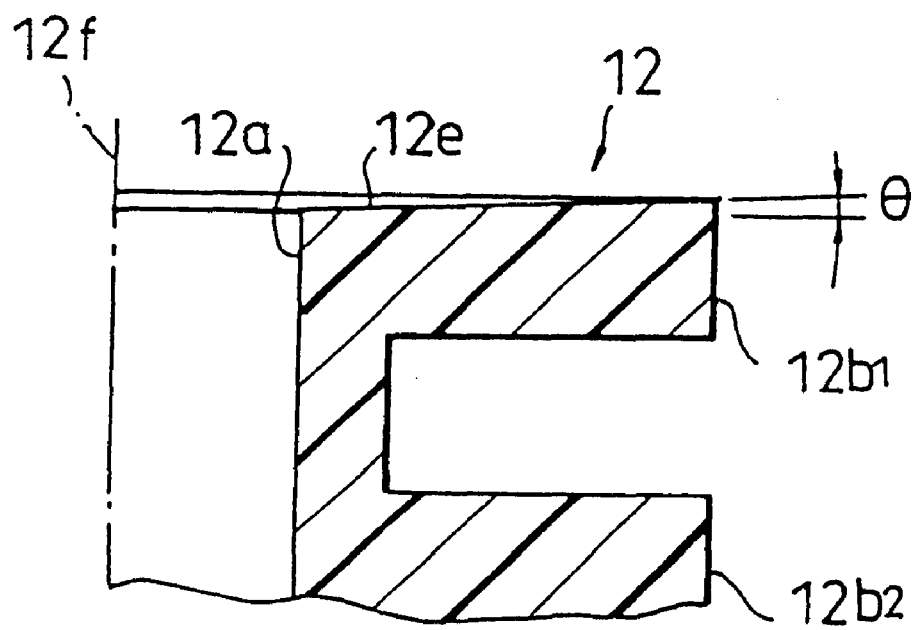
FIG. 2B is an enlarged fragmentary sectional view of an upstream end of the nozzle.

FIG. 1 is a vertical sectional view of an ultrasonic shower cleaning apparatus according to one embodiment of the present invention. FIG. 2A is a perspective view of a nozzle. FIG. 2B is an enlarged fragmentary view of an upstream end of the nozzle. Referring specifically to FIG. 1, an ultrasonic shower cleaning apparatus 10 includes a substantially cylindrical casing 11, and a nozzle 12 mounted to the lower or downstream end of the casing 11. Disposed within the casing 11 is an ultrasonic vibratory element or ultrasonic transducer 13 in the form of a circular disk arranged in a face-to-face relation to the upstream end 12e of the nozzle 12. The ultrasonic transducer 13 has an integral vibratory plate 13a in the form of a circular disk. The vibratory plate 13a has a vibratory face oriented to face the upstream end 12e of the nozzle 12. An inlet port 14 is formed in the lateral periphery of the casing 11 to allow introduction of a cleaning liquid into the apparatus 10. Three bolt holes 15 (only one is shown in FIG. 1) are also formed in the lateral periphery of the casing 11 to receive corresponding bolts (not shown) so as to secure the ultrasonic shower cleaning apparatus 10 in place.

The upstream end 12e of the nozzle 12 which faces the vibratory plate 13a is also circular in shape. An outlet port 12a of a right circular cylindrical shape extends axially and centrally through the nozzle 12. As shown in FIG. 2B, the upstream end face 12e of the nozzle 12 is cone-shaped so as to be tapered in a direction toward the downstream end of the nozzle from its outer edge to the outlet port 12a at a predetermined angle θ, for example, of 2.5°, with respect to a plane perpendicular to an axis 12f of the nozzle 12. The angle θ of inclination may be in the range from 0.5° to 15°.

With continuing reference to FIGS. 1 and 2A, a rectifier or guide mechanism 12b is arranged on the outer periphery of the nozzle 12 adjacent to the upstream end 12e of the nozzle 12 so as to direct the flow of a cleaning liquid to the upstream end of the outlet port 12a. Specifically, the guide mechanism 12b includes two annular flanges $12b_1$, $12b_2$ spaced along the length of the nozzle 12. The annular flange $12b_1$ which is closer to the ultrasonic transducer 13 than the other flange $12b_2$ forms the upstream end face 12e of the nozzle 12. The annular flange $12b_1$ has a thickness approximately one-fourth of the wavelength λ of ultrasonic waves transmitted through the annular flange $12b_1$ so as to effectively reflect ultrasonic waves emitted by the ultrasonic transducer 13 after they propagate from the ultrasonic transducer 13. The thickness of the annular flange $12b_1$ may vary with the wavelength of ultrasonic waves used.

External threads 12c are formed in the outer periphery of the nozzle 12 adjacent to its lower end. Correspondingly, internal threads are formed in the casing 11. The external threads 12c are engaged with the internal threads to secure the nozzle 12 to the casing 11. A protrusion 12d is formed on the outer periphery of the nozzle 12 below the external threads 12c and extends radially beyond the external threads 12c. The protrusion 12d serves as a stop to hold the nozzle 12 in an appropriate position.

Figure 3:
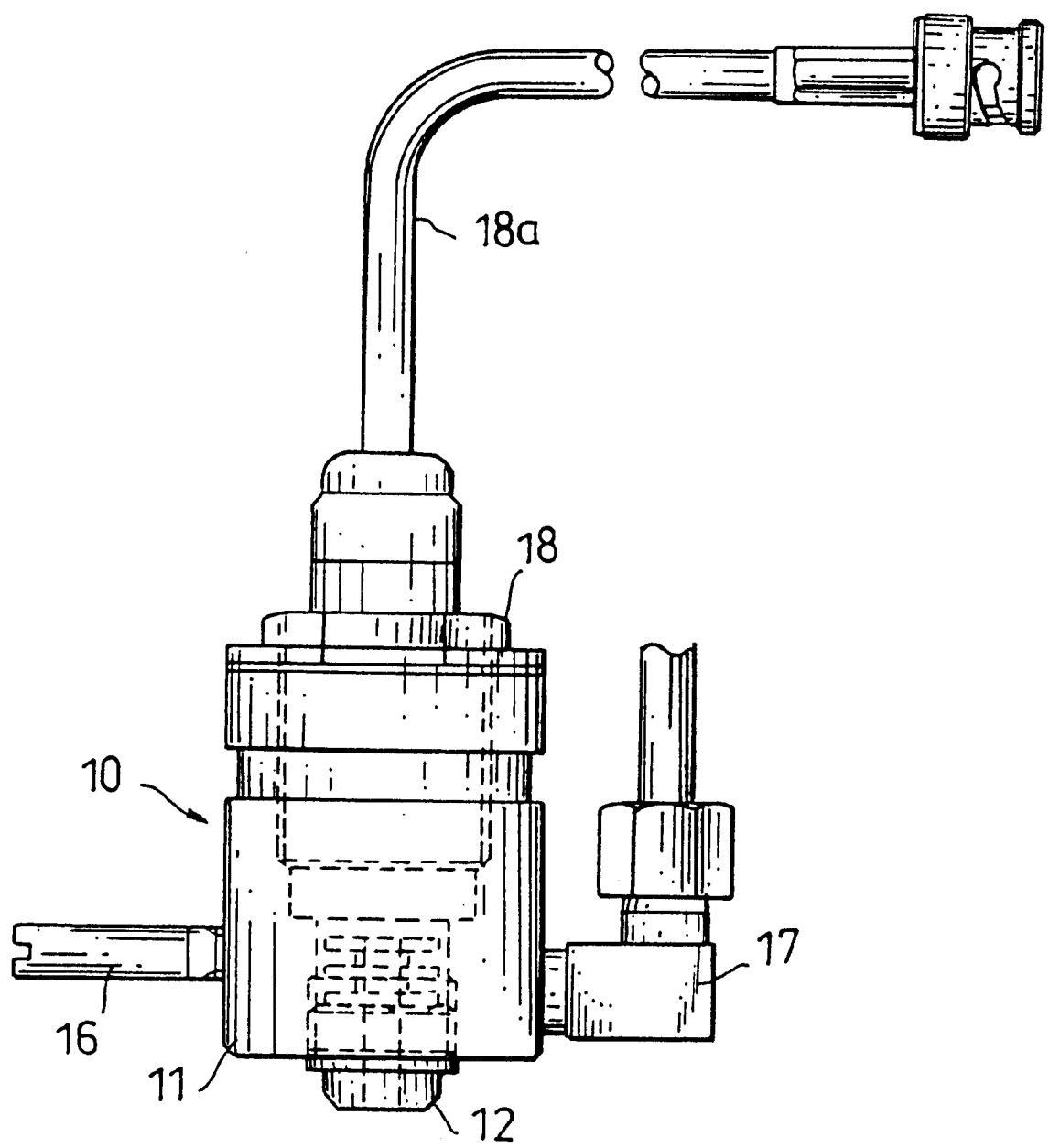
FIG. 3 is a schematic view illustrating the ultrasonic shower cleaning apparatus in use.

Referring to FIG. 3, the ultrasonic shower cleaning apparatus 10 is fixed to a suitable support or holder (not shown) by bolts 16. A feed pipe 17 is coupled to the inlet port 14 so as to feed a cleaning liquid to the apparatus 10. An adapter 18 is attached to the upper end of the casing 11. The adapter 18 is connected to an ultrasonic generator (not shown) through a cord 18a so as to supply electrical power to the ultrasonic transducer 13.

A cleaning liquid, after fed through the inlet port 14, is directed to the upstream end of the outlet port 12a by the guide mechanism 12b while being rectified. The cleaning liquid then enters an entrance of the outlet port 12a as a uniform flow and flows through the outlet port 12a, to thereby provide a column stream of cleaning liquid. The column stream of cleaning liquid is ejected as a uniform stream from the downstream end of the outlet port 12a. At the same time, ultrasonic waves are emitted by the ultrasonic transducer 13. Some of the ultrasonic waves are directly transmitted along and through the outlet port 12a and discharged from the tip of the nozzle 12. Therefore, these ultrasonic waves will not be focused to a fixed point. The other ultrasonic waves are repeatedly reflected between the face of the vibratory plate 13a of the ultrasonic transducer 13 and the cone-shaped end face 12e of the nozzle 12 or upper surface of the annular flange $12b_1$. These ultrasonic waves are thereafter introduced into the outlet port 12a. The ultrasonic waves are repeatedly reflected within the outlet port 12a before they are released from the outlet port 12a. Many of these ultrasonic waves will not be focused to a fixed point as such since the outlet port 12a is formed to have a right circular cylindrical shape of a fixed diameter. By this arrangement, the column stream of cleaning liquid is irradiated over the entire area thereof with the ultrasonic waves. This eliminates the need to finely adjust the distance between the tip of the nozzle 12 and an article to be cleaned.

Figure 4:
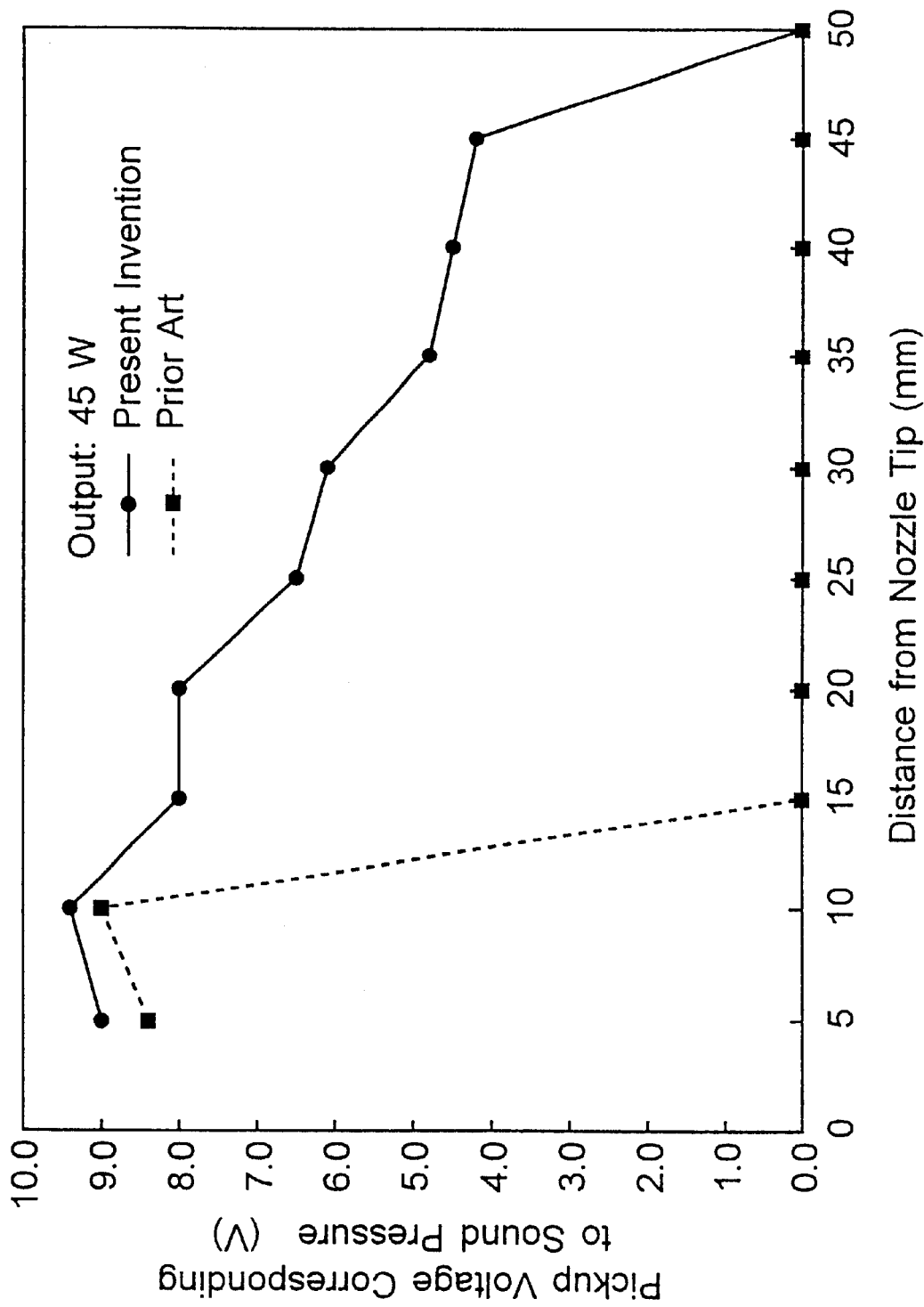
FIG. 4 is a graph showing sound pressure versus distance from the nozzle, by the use of the ultrasonic shower cleaning apparatus of the present invention and a conventional ultrasonic shower cleaning apparatus shown in FIG. 7.
Figure 5:
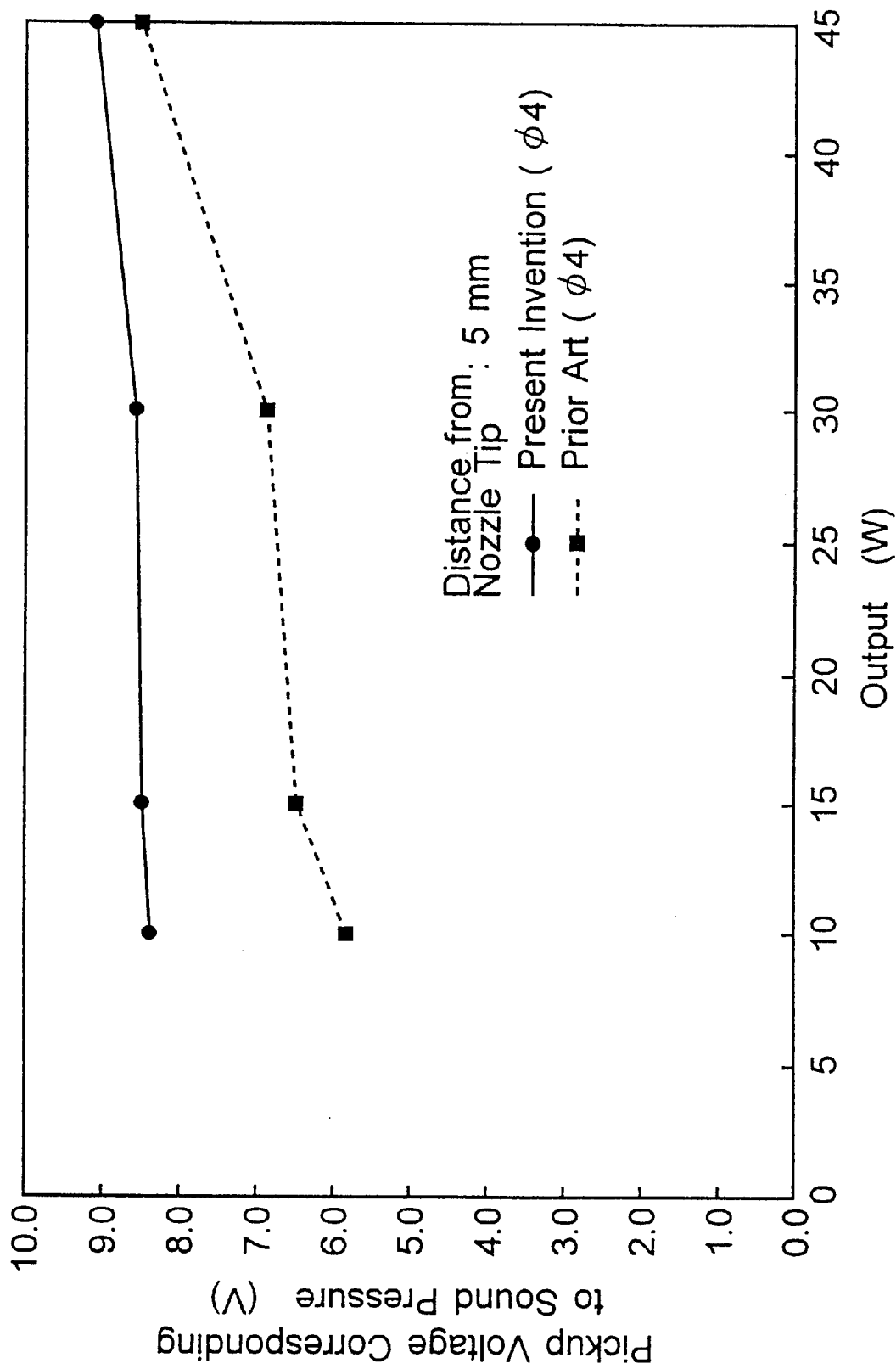
FIG. 5 is a graph showing sound pressure versus output wattage at a distance of 5 mm from the tip of the nozzle, by the use of the ultrasonic shower cleaning apparatus of the present invention and the conventional ultrasonic shower cleaning apparatus.
Figure 6:
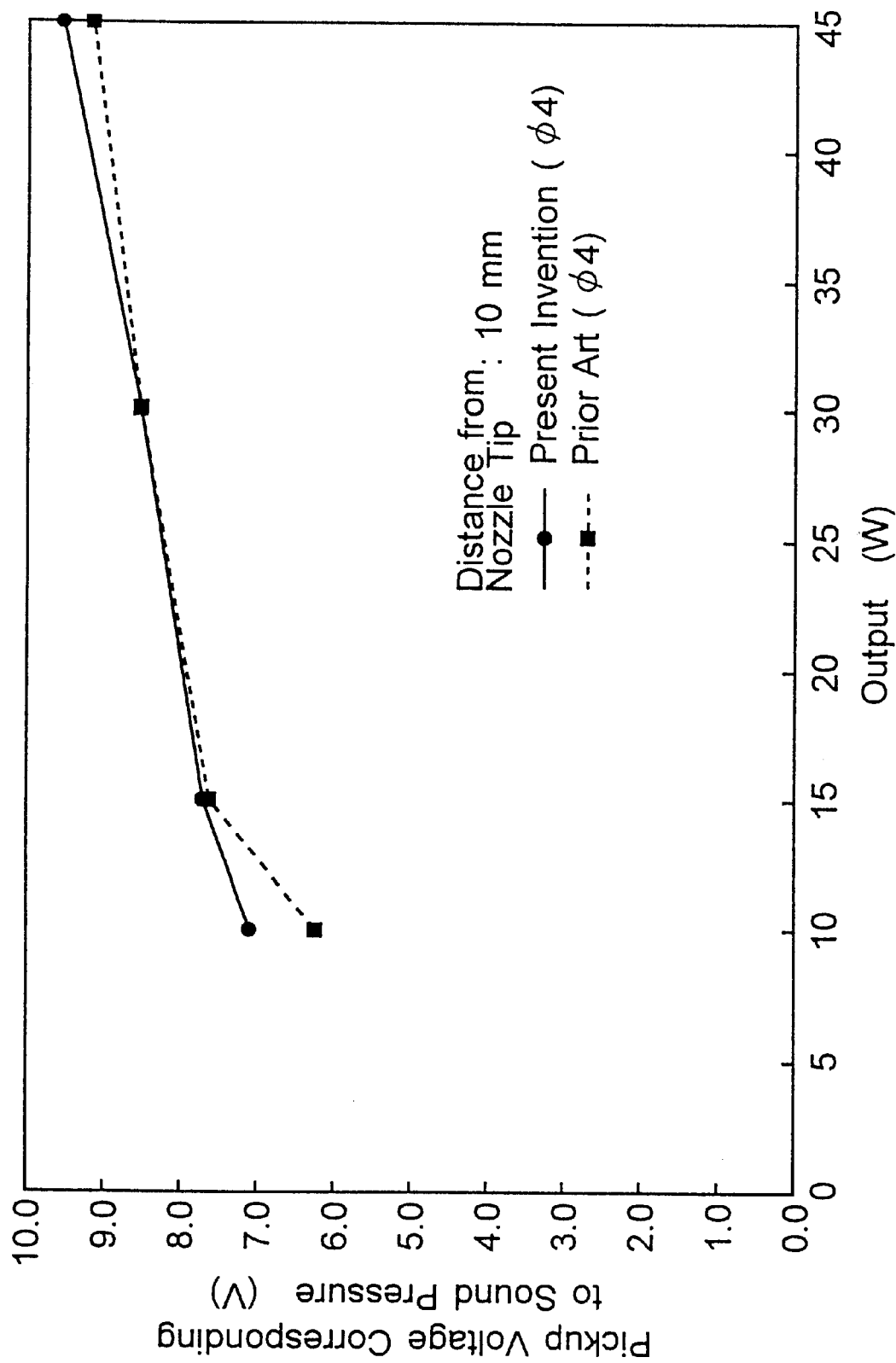
FIG. 6 is a graph similar to that of FIG. 5, but at a distance of 10 mm from the tip of the nozzle.
Figure 7:
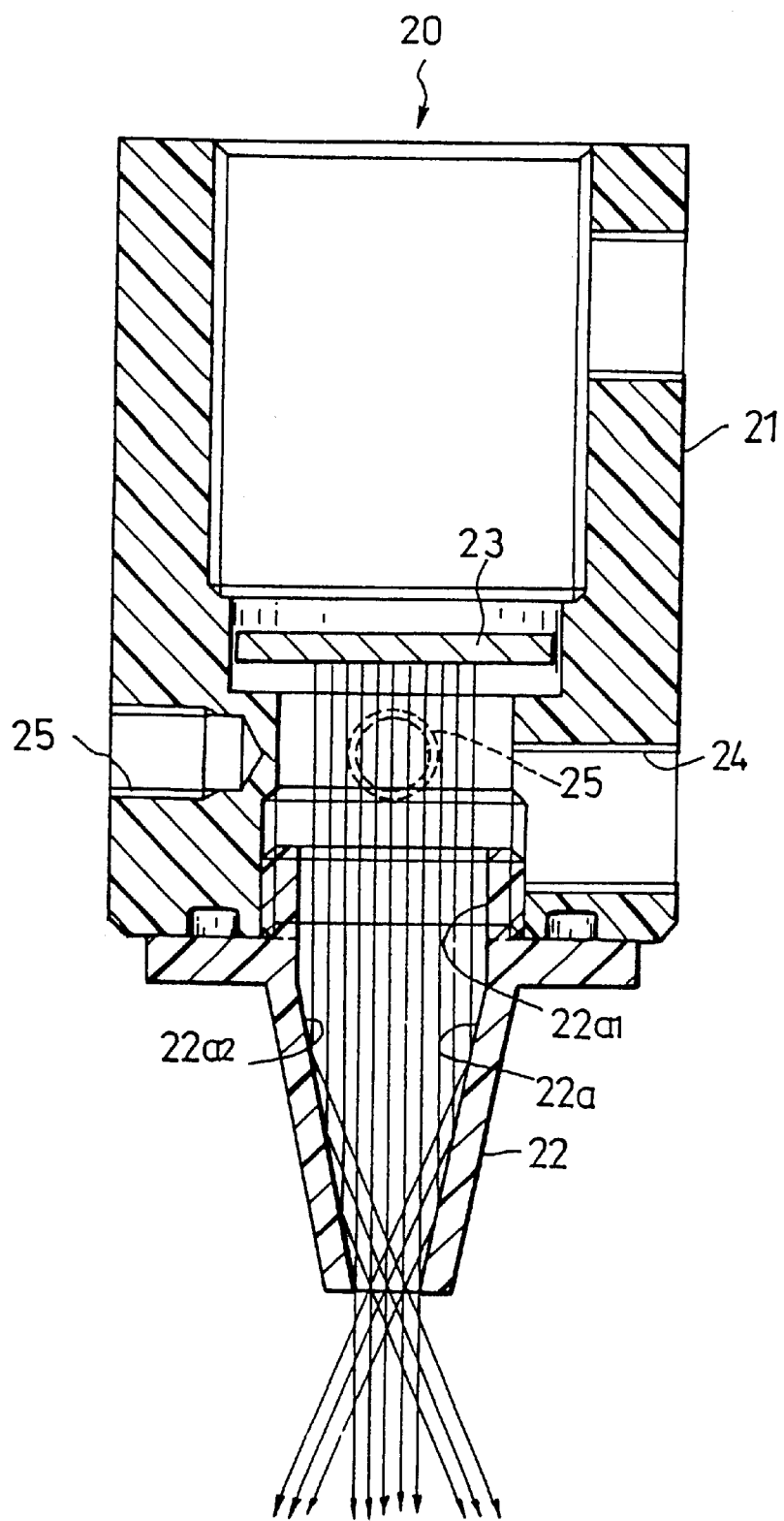
FIG. 7 is a vertical sectional view showing a conventional ultrasonic shower cleaning apparatus.
Figure 8:
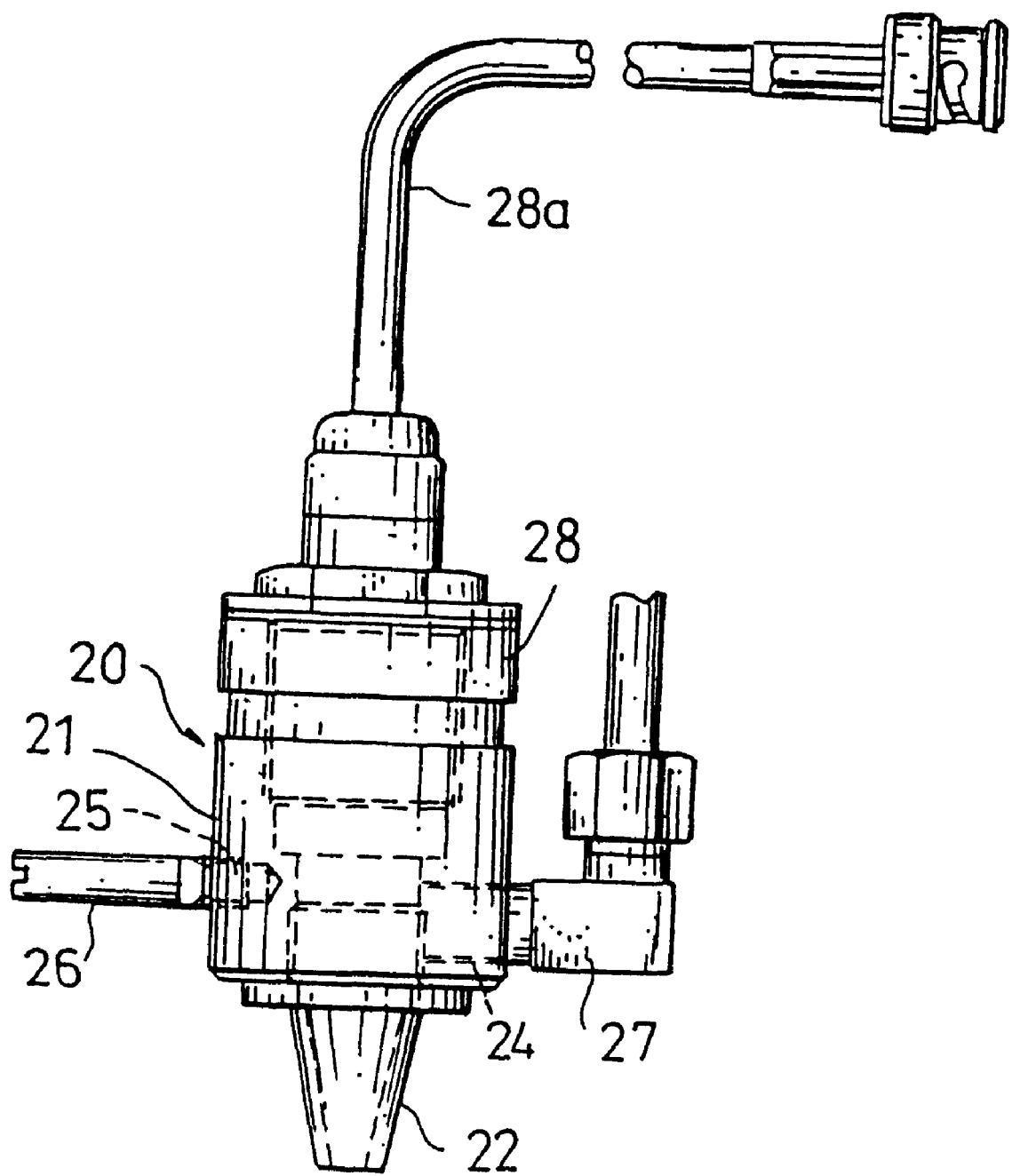
FIG. 8 is a schematic view illustrating the conventional ultrasonic shower cleaning apparatus in use.

The results of experiments carried out by the use of the apparatus 10 of the present invention and the known apparatus 20, wherein the outlet port of the nozzle in each apparatus has a diameter of 4 mm at the downstream end thereof, are shown in FIGS. 4 to 6. FIG. 4 is a graphical illustration of sound pressure or acoustic pressure versus distance between the tip of the nozzle and a point of measurement when the ultrasonic transducer is energized with an output of 45 W. In the prior art apparatus 20, the sound pressure is substantially maximized when the distance from the tip of the nozzle is between 5 mm and 12 mm. The sound pressure sharply drops when the distance exceeds 12 mm and becomes zero when the distance reaches 15 mm. In the apparatus 10 of the present invention, the sound pressure is also maximized when the distance is between 5 mm and 12 mm. However, the sound pressure does not decreases sharply, but moderately decreases so that it becomes zero when the distance is 50 mm. This means that in the present invention, ultrasonic waves, after transmitted through the tip of the nozzle, will not be focused to any point.

FIGS. 5 and 6 show sound pressure versus output wattage while the distance between the tip of the nozzle and a point of measurement is fixed (for example, 5 or 10 mm). As shown, the sound pressure does not substantially vary with the output wattage in either of the prior art apparatus 20 and the apparatus 10 of the present invention.

In the illustrated embodiment, the nozzle 12 is preferably made of a material selected from the group consisting of polyetheretherketone, tantalum, titanium, quartz, stainless steel, polytetrafluoroethylene, sapphire, and the like. The vibratory plate 13a of the ultrasonic transducer 13 is preferably made of a material selected from the group consisting of tantalum, titanium, quartz, stainless steel, sapphire, and the like. Also, the casing 11 is preferably made of a material selected from the group consisting of polyetheretherketone, tantalum, titanium, quartz, stainless steel, polytetrafluoroethylene, sapphire, and the like.

With the selected materials, the nozzle 12, the vibratory plate 13a and the casing 11 will not be melted if ultrasonic waves are focused within the apparatus 10. This is not the case when they are made of ordinary plastics.

While the invention has been described in connection with certain preferred embodiments, it will be understood that it is not intended to limit the invention to these particular embodiments. On the contrary, it is intended to cover all alternatives, modifications, and equivalent arrangements as may be included within the spirit and scope of the invention as defined by the appended claims.

What is claimed is:

1. An ultrasonic shower cleaning apparatus comprising:

a casing having an upstream end, a downstream end and a lateral periphery, said casing including an inlet port formed in said lateral periphery through which a cleaning liquid is introduced thereinto;

a nozzle mounted to said downstream end of said casing and having an upstream end and a downstream end, said nozzle including an outlet port of a substantially right circular cylindrical shape which has a fixed diameter and extends axially through said nozzle, said outlet port being communicated with said inlet port;

an ultrasonic transducer of a circular disk shape mounted within said casing and oriented to face said upstream end of said nozzle, said ultrasonic transducer being operable to emit ultrasonic waves toward said upstream end of said nozzle;

said nozzle having an upstream end face and an outer edge, said upstream end face of said nozzle being cone-shaped so as to be tapered in a direction toward said downstream end of said nozzle from said outer edge of said nozzle to said outlet port at a predetermined angle, an article placed in front of said nozzle being cleaned with cleaning liquid and ultrasonic waves spouted from said outlet port at said downstream end of said nozzle; and a guide mechanism arranged on said outer edge of said nozzle for directing a flow of the cleaning fluid through said inlet port to an entrance of said outlet port as a uniform flow.

2. The ultrasonic shower cleaning apparatus as defined in claim 1, wherein said guide mechanism includes a plurality of axially spaced annular flanges.

3. The ultrasonic shower cleaning apparatus as defined in claim 2, wherein one of said plurality of annular flanges which is located closest to said ultrasonic transducer forms said upstream end face of said nozzle, said one annular flange having such a thickness that the ultrasonic waves may effectively be reflected therefrom.

4. The ultrasonic shower cleaning apparatus as defined in claim 3, wherein the thickness of said one annular flange is approximately one-fourth of a wavelength of the ultrasonic waves which propagate through said one annular flange.

5. The ultrasonic shower cleaning apparatus as defined in claim 1, wherein said predetermined angle of said upstream end face of said nozzle is in the range from 0.5° to 15° with respect to a plane perpendicular to an axis of said nozzle.

6. The ultrasonic shower cleaning apparatus as defined in claim 2, wherein said predetermined angle of said upstream end face of said nozzle is in the range from 0.5° to 15° with respect to a plane perpendicular to an axis of said nozzle.

7. The ultrasonic shower cleaning apparatus as defined in claim 3, wherein said predetermined angle of said upstream end face of said nozzle is in the range from 0.5° to 15° with respect to a plane perpendicular to an axis of said nozzle.

8. The ultrasonic shower cleaning apparatus as defined in claim 4, wherein said predetermined angle of said upstream end face of said nozzle is in the range from 0.5° to 15° with respect to a plane perpendicular to an axis of said nozzle.

9. An apparatus for ultrasonically cleaning an article with a shower of cleaning liquid, said apparatus comprising:

a casing including an inlet port through which a cleaning liquid is introduced thereinto, said casing having an upstream end and a downstream end;

a nozzle mounted to said downstream end of said casing and having an upstream end and a downstream end, said nozzle including a substantially cylindrical outlet port extending axially therethrough, said outlet port being communicated with said inlet port;

an ultrasonic transducer mounted within said casing and oriented to face said upstream end of said nozzle, said ultrasonic transducer being operable to emit ultrasonic waves toward said upstream end of said nozzle; and guide means arranged on said nozzle for directing a flow of the cleaning fluid which is laterally fed through said inlet port to an entrance of said outlet port to make it a uniform flow;

said nozzle having an upstream end face and an outer edge, said upstream end face of said nozzle being cone-shaped so as to be tapered in a direction toward said downstream end of said nozzle from said outer edge of said nozzle to said outlet port, whereby one part of the ultrasonic waves passes axially through said outlet port, and the other part of the ultrasonic waves is reflected between said ultrasonic transducer and said upstream end face of said nozzle before said other part of the ultrasonic waves enters said outlet port, said other part of the ultrasonic waves being reflected within said outlet port, and thereafter said other part of the ultrasonic waves being transmitted form said downstream end of said nozzle toward the article.

10. The apparatus as defined in claim 9, wherein said guide means includes a plurality of axially spaced annular disks disposed on an outer periphery of said nozzle.

11. The apparatus as defined in claim 10, wherein one of said plurality of annular disks which is located closest to said ultrasonic transducer forms said upstream end face of said nozzle, said one annular disk having a thickness approximately one-fourth of a wavelength of the ultrasonic waves which propagate through said one annular disk.

12. The apparatus as defined in claim 9, wherein said upstream end face of said nozzle is tapered at an angle of 0.5° to 15° with respect to a plane perpendicular to an axis of said nozzle.

13. The apparatus as defined in claim 10, wherein said upstream end face of said nozzle is tapered at an angle of 0.5° to 15° with respect to a plane perpendicular to an axis of said nozzle.

14. The apparatus as defined in claim 11, wherein said upstream end face of said nozzle is tapered at an angle of 0.5° to 15° with respect to a plane perpendicular to an axis of said nozzle.

15. An ultrasonic shower cleaning apparatus comprising:
a casing having an upstream end, a downstream end and a lateral periphery, said casing including an inlet port formed in said lateral periphery through which a cleaning liquid is introduced thereinto;
a nozzle mounted to said downstream end of said casing and having an upstream end and a downstream end, said nozzle including an outlet port of a substantially right circular cylindrical shape which has a fixed diameter and extends axially through said nozzle, said outlet port being communicated with said inlet port; and
an ultrasonic transducer of a circular disk shape mounted within said casing and oriented to face said upstream end of said nozzle, said ultrasonic transducer being operable to emit ultrasonic waves toward said upstream end of said nozzle;
said nozzle having an upstream end face facing said ultrasonic transducer whereby said ultrasonic waves emitted from said ultrasonic transducer are repeatedly reflected between said ultrasonic transducer and said upstream end face of said nozzle before entering said outlet port, said upstream end face of said nozzle further being cone-shaped so as to be tapered in a direction toward said downstream end of said nozzle from said outer edge of said nozzle to said outlet port at a predetermined angle, an article placed in front of said nozzle being cleaned with cleaning liquid and ultrasonic waves spouted from said outlet port at said downstream end of said nozzle.

16. The ultrasonic shower cleaning apparatus as defined in claim 15, further comprising a guide mechanism arranged on said outer edge of said nozzle for directly a flow of the cleaning fluid fed through said inlet port to an entrance of said outlet port as a uniform flow.

17. The ultrasonic shower cleaning apparatus as defined in claim 16 wherein said guide mechanism includes a plurality of axially spaced annular flanges.

18. The ultrasonic shower cleaning apparatus as defined in claim 17 wherein one of said plurality of annular flanges which is located closest to said ultrasonic transducer forms said upstream end face of said nozzle, said one annular flange having such a thickness that the ultrasonic waves may effectively be reflected therefrom.

19. The ultrasonic shower cleaning apparatus as defined in claim 18, wherein the thickness of said one annular flange is approximately one-fourth of a wavelength of the ultrasonic waves which propagate through said one annular flange.

20. The ultrasonic shower cleaning apparatus as defined in claim 15, wherein said predetermined angle of said upstream end face of said nozzle is in the range of from 0.5° to 15° with respect to a plane perpendicular to an axis of said nozzle.

21. An apparatus for ultrasonically cleaning an article with a shower of cleaning liquid, said apparatus comprising:
a casing including an inlet port through which a cleaning liquid is introduced thereinto, said casing having an upstream end and a downstream end;
a nozzle mounted to said downstream end of said casing and having an upstream end and a downstream end, said nozzle including a substantially cylindrical outlet port extending axially therethrough, said outlet port being communicated with said inlet port; and
an ultrasonic transducer mounted within said casing and oriented to face said upstream end of said nozzle, said ultrasonic transducer being operable to emit ultrasonic waves toward said upstream end of said nozzle;
said nozzle having an upstream end face and an outer edge, said upstream end face of said nozzle facing said ultrasonic transducer and being cone-shaped so as to be tapered in a direction toward said downstream end of said nozzle from said outer edge of said nozzle to said outlet port, whereby a first portion of said ultrasonic waves passes axially through said outlet port and a second portion of said ultrasonic waves is repeatedly reflected between said ultrasonic transducer and said upstream end face of said nozzle before entering said outlet port, said second portion of said ultrasonic waves being reflected within said outlet port and thereafter being transmitted from said downstream end of said nozzle towards said article.

22. The apparatus as defined in claim 21 further comprising guide means arranged on said nozzle for directing a flow of said cleaning fluid which is laterally fed through said inlet port to an entrance of said outlet port to make it a uniform flow.

23. The apparatus as defined in claim 22 wherein said guide means includes a plurality of axially spaced annular disks disposed on said outer edge of said nozzle.

24. The apparatus as defined in claim 23 wherein one of said plurality of annular disks which is located closest to said ultrasonic transducer forms said upstream end face of said nozzle, said one annular disk having a thickness approximately one-fourth of a wave length of the ultrasonic waves which propagate through said one annular disk.

25. The apparatus as defined in claim 15 wherein said upstream end face of said nozzle is tapered at an angle of 0.5° to 15° with respect to a plane perpendicular to an axis of said nozzle.

* * * * *

UNITED STATES PATENT AND TRADEMARK OFFICE
CERTIFICATE OF CORRECTION

PATENT NO. : 6,241,162 B1
DATED : June 5, 2001
INVENTOR(S) : Takahashi et al.

It is certified that error appears in the above-identified patent and that said Letters Patent is hereby corrected as shown below:

Column 7,
Line 51, "directly" should read -- directing --.

Signed and Sealed this

Nineteenth Day of February, 2002

Attest:

Attesting Officer

JAMES E. ROGAN
Director of the United States Patent and Trademark Office